United States Patent
Dornauer et al.

(10) Patent No.: US 10,177,070 B2
(45) Date of Patent: Jan. 8, 2019

(54) FLEXIBLE GRAPHITE SHEET SUPPORT STRUCTURE AND THERMAL MANAGEMENT ARRANGEMENT

(71) Applicant: Advanced Energy Technologies LLC, Lakewood, OH (US)

(72) Inventors: Frank P. Dornauer, Valley City, OH (US); Greg P. Kramer, Lyndhurst, OH (US); Martin D. Smalc, Parma, OH (US)

(73) Assignee: NeoGraf Solutions, LLC, Lakewood, OH (US)

( * ) Notice: Subject to any disclaimer, the term of this patent is extended or adjusted under 35 U.S.C. 154(b) by 0 days.

(21) Appl. No.: 15/529,644

(22) PCT Filed: Dec. 2, 2015

(86) PCT No.: PCT/US2015/063509
§ 371 (c)(1),
(2) Date: May 25, 2017

(87) PCT Pub. No.: WO2016/094150
PCT Pub. Date: Jun. 16, 2016

(65) Prior Publication Data
US 2017/0365538 A1 Dec. 21, 2017

Related U.S. Application Data

(60) Provisional application No. 62/090,244, filed on Dec. 10, 2014.

(51) Int. Cl.
*H01L 23/00* (2006.01)
*H01L 23/373* (2006.01)
(Continued)

(52) U.S. Cl.
CPC .......... *H01L 23/3738* (2013.01); *F28F 21/02* (2013.01); *H01L 23/3672* (2013.01);
(Continued)

(58) Field of Classification Search
CPC .. H05K 7/20; H05K 7/20445; H05K 7/20454; H05K 7/2039; H05K 7/20472;
(Continued)

(56) References Cited

U.S. PATENT DOCUMENTS

| | | |
|---|---|---|
| 4,840,225 A | 6/1989 | Foley et al. |
| 5,218,516 A | 6/1993 | Collins et al. |

(Continued)

FOREIGN PATENT DOCUMENTS

| | | | |
|---|---|---|---|
| DE | 37338897 A1 | 5/1989 | |
| EP | 0675382 A1 | 10/1995 | |
| EP | 3243366 A1 | * 11/2017 | |

*Primary Examiner* — Alexander Oscar Williams

(57) ABSTRACT

A flexible graphite sheet support structure forms a thermal management arrangement for device having a heat source. The flexible graphite sheet support structure includes first and second spaced apart support members and a flexible graphite sheet secured to the spaced apart support members forming a free standing flex accommodating section that spans between them. Curve retention members having convex curved surfaces are used to keep the flex accommodating section in a bell shaped curve while preventing the flexible graphite sheet from exceeding a minimum bend radius. The thermal management arrangement formed by the flexible graphite sheet support structure enables the flexible graphite sheet to move heat from one support structure to the other while reducing the transmission of vibration between them and allowing relative movement between the spaced apart support structures.

29 Claims, 4 Drawing Sheets

(51) Int. Cl.
 *H01L 23/367* (2006.01)
 *F28F 21/02* (2006.01)
 *H01L 33/64* (2010.01)

(52) U.S. Cl.
 CPC ......... *F28F 2255/02* (2013.01); *H01L 33/641* (2013.01); *H01L 33/642* (2013.01)

(58) Field of Classification Search
 CPC .. H05K 7/20481; C01B 32/182; C01B 31/04; H01L 23/373; H01L 23/14; H01L 2924/0002; H01L 2924/00; H01L 23/433; H01L 23/3738; H01L 23/3672; H01L 33/642; H01L 33/641
 USPC .......... 257/713, 718, 706; 361/78, 720, 709, 361/710, 704, 705, 708, 711, 719; 165/80.3, 104.33, 185
 See application file for complete search history.

(56) References Cited

U.S. PATENT DOCUMENTS

| | | | |
|---|---|---|---|
| 5,276,584 A | 1/1994 | Collins et al. | |
| 5,486,652 A | 1/1996 | Kasper | |
| 5,486,841 A | 1/1996 | Hara et al. | |
| 5,544,099 A | 8/1996 | Quint et al. | |
| 5,781,411 A | 7/1998 | Feenstra | |
| 5,812,224 A | 9/1998 | Maeda et al. | |
| 6,229,701 B1 | 5/2001 | Kung et al. | |
| 6,474,074 B2 | 11/2002 | Ghoshal et al. | |
| 6,532,152 B1 | 3/2003 | White et al. | |
| 6,580,608 B1 | 6/2003 | Searls et al. | |
| 6,799,628 B1 | 10/2004 | Masseth et al. | |
| 6,826,047 B1 | 11/2004 | Chen et al. | |
| 7,188,484 B2 | 3/2007 | Kim | |
| 7,319,590 B1 | 1/2008 | Ingram | |
| RE40,369 E | 6/2008 | Miyahara et al. | |
| 7,457,133 B2 | 11/2008 | Chiang et al. | |
| 7,596,956 B2 | 10/2009 | Lilke | |
| 7,688,586 B2 | 3/2010 | Tomioka | |
| 7,719,856 B2 | 5/2010 | Nelson et al. | |
| 7,903,405 B1 | 3/2011 | Miller et al. | |
| 8,125,075 B2 | 2/2012 | Maveery et al. | |
| 8,451,604 B2 | 5/2013 | Bhattacharya et al. | |
| 8,520,381 B2 | 8/2013 | Hobein et al. | |
| 8,611,088 B2 | 12/2013 | Barna | |
| 8,952,565 B2 | 2/2015 | Kroulik et al. | |
| 9,059,129 B2 | 6/2015 | Wavering | |
| 9,271,427 B2 | 2/2016 | Kilroy et al. | |
| 9,329,689 B2 | 5/2016 | Osterhout et al. | |
| 9,545,030 B2 | 1/2017 | Nikkhoo et al. | |
| 2005/0168941 A1 | 8/2005 | Soko et al. | |
| 2007/0159799 A1* | 7/2007 | Dando, III | H05K 7/20445 361/709 |
| 2010/0079356 A1 | 4/2010 | Hoellwarth | |
| 2010/0167636 A1 | 7/2010 | Bhattacharya et al. | |
| 2011/0108805 A1* | 5/2011 | Okai | H01L 29/1606 257/26 |
| 2012/0000627 A1 | 1/2012 | Jewell-Larson et al. | |
| 2012/0113595 A1* | 5/2012 | Petroski | B32B 37/12 361/704 |
| 2012/0192265 A1 | 7/2012 | Arnouse | |
| 2012/0212399 A1 | 8/2012 | Border et al. | |
| 2012/0212484 A1 | 8/2012 | Miller et al. | |
| 2012/0250254 A1 | 10/2012 | Kojyo et al. | |
| 2013/0100511 A1 | 4/2013 | Yamamoto et al. | |
| 2013/0183566 A1* | 7/2013 | Wayne | H01M 2/105 429/120 |
| 2013/0222235 A1 | 8/2013 | Abdollahi et al. | |
| 2013/0314303 A1 | 11/2013 | Osterhout et al. | |
| 2014/0160668 A1 | 6/2014 | Heymann et al. | |
| 2015/0220122 A1 | 8/2015 | Rhee et al. | |
| 2015/0342089 A1 | 11/2015 | Kim et al. | |
| 2016/0212879 A1 | 7/2016 | Nikkhoo et al. | |

* cited by examiner

FLEXIBLE GRAPHITE SHEET SUPPORT STRUCTURE AND THERMAL MANAGEMENT ARRANGEMENT

TECHNICAL FIELD

The disclosure relates to the use of flexible graphite for thermal management of heat source, and more particularly to a flexible graphite support structure that reduces transmission of vibration while allowing for relative movement between different support members.

BACKGROUND

As electronic devices become more powerful and more ubiquitous, new challenges are presented, in particular when electronic devices are employed in difficult and hostile environments. A principle design concern in many electronic devices is the removal of excess heat to ensure proper performance and prevent damage to the components. This goal is made more difficult when the electronic device requires protection from other failure vectors such as, for example, vibration or relative movement between spaced apart support members.

There is therefore a need in the art for a support arrangement for the graphite sheet capable of maintaining the sheet in a predetermined shape as it extends between spaced apart support members.

BRIEF DESCRIPTION

A flexible graphite sheet support structure is disclosed. The flexible graphite sheet support structure includes a first support member and a second support member spaced apart from the first support member, wherein one of the first and second support members is adapted for movement relative to the other, a flexible graphite sheet secured to the first and second spaced apart support members and having a free standing flex accommodating section extending between the first and second spaced apart members, wherein the flex accommodating section is bell curve-shaped having a central curved portion disposed between oppositely disposed outwardly facing concave curved portions, and a first curve retention member having a convex curved surface disposed adjacent and facing a respective one of the outwardly facing concave curved portions and a second curve retention member having convex curved surface disposed adjacent and facing the other one of the outwardly facing concave curved portions, wherein the flexible graphite sheet is not secured to the convex curved surfaces.

DETAILED DESCRIPTION

Figure 1:
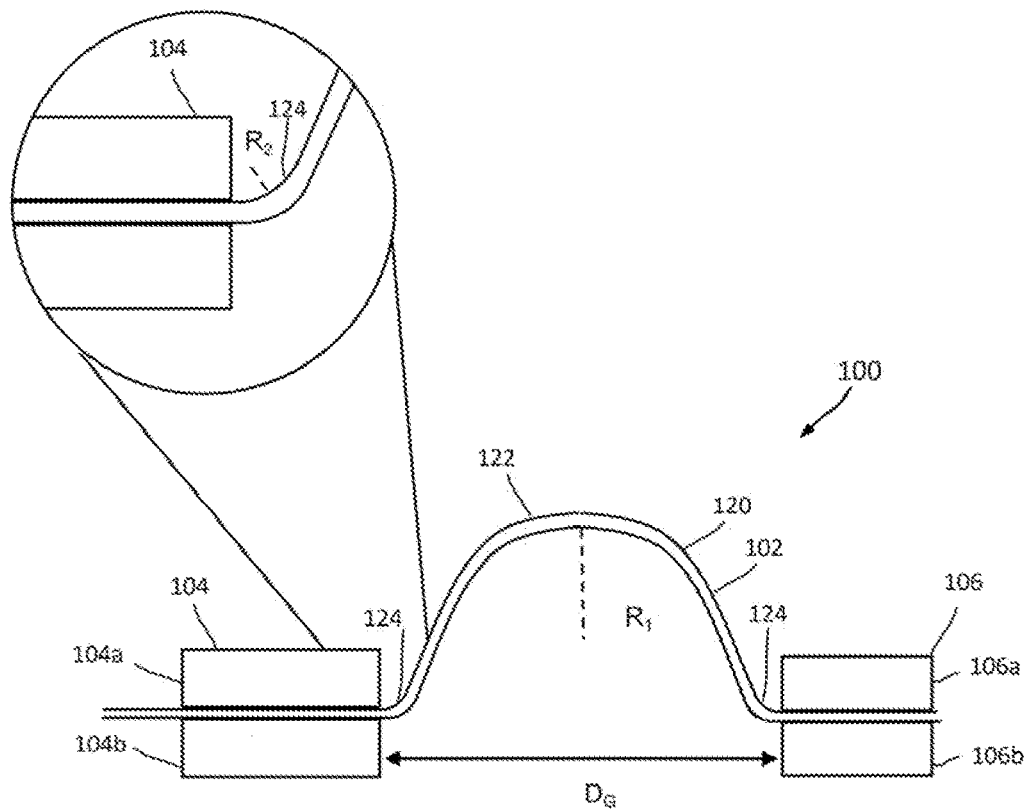
FIG. 1 is a side view of a flexible graphite sheet supported between spaced apart support members without curve retention members.

With reference to FIG. 1, a flexible graphite sheet arrangement is shown generally at 100. The arrangement 100 includes a flexible graphite sheet 102 extending between a pair of spaced apart support members 104 and 106. The spaced apart support members 104, 106 are spaced apart by a distance $D_G$. The spaced apart support members 104, 106 can each include one or more members. For example, a pair of support members 104a, 104b and 106a, 106b are shown in FIG. 1 for each member by the way of example. The spaced apart support members 104, 106 can be connected together or part of a larger assembly, if so desired. The flexible graphite sheet 102 is secured to the spaced apart support members 104, 106 in any suitable manner. In one example, the graphite sheet 102 is adhesively bonded to the spaced apart support members, in another example, the pair of support members 104a, 104b and 106a, 106b clamp the sheet between them. In another example, mechanical fasteners are used to secure the sheet to the support members. In another example, a suitable combination of adhesive bonding, clamping and/or mechanical fasteners can be used.

Figure 2:
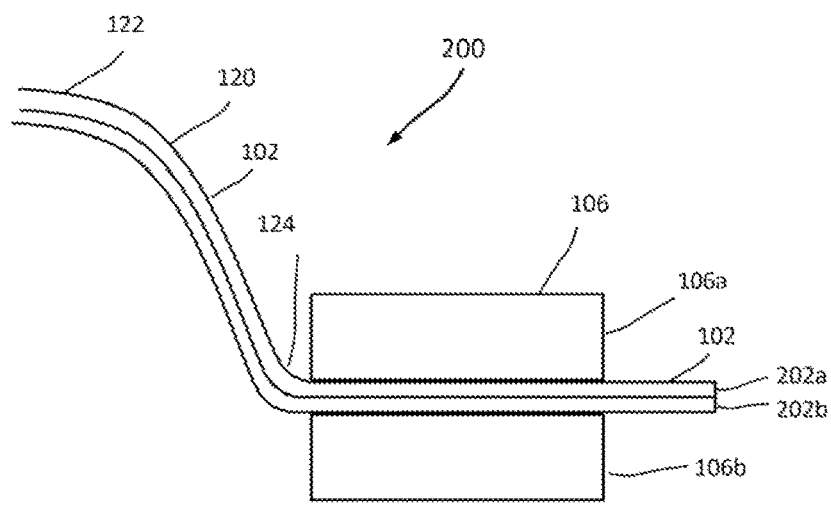
FIG. 2 is an enlarged side view of a flexible graphite sheet having a plurality of sheets having a sharp bend when curve retention members are not used.

Referring now to FIGS. 1 and 2, the graphite sheet 102 is formed of one or more sheets of flexible graphite. One non-limiting example shown generally at 102 in FIG. 2 includes two sheets 202a and 202b; though it should be appreciated that the graphite sheet 102 can include any suitable number of sheets of flexible graphite. The flexible graphite sheet 102 may include compressed particles of exfoliated graphite. In other embodiments, the flexible graphite sheet 102 includes one or more layers of pyrolytic graphite with one or more support layers. In still other embodiments, the flexible graphite sheet 102 may be formed of both pyrolytic graphite and one or more sheets of compressed particles of exfoliated graphite. The term "pyrolytic graphite" is a graphitized graphitizable polymer.

In one or more embodiments, the plurality of graphite sheets 202a, 202b, etc., may be laminated into a unitary article referred to generally as sheet 102 for use as disclosed herein. The sheets 202a, 202b, may be laminated with a suitable adhesive, such as pressure sensitive or thermally activated adhesive, therebetween. The adhesive chosen should balance bonding strength with minimizing thickness, and be capable of maintaining adequate bonding at the service temperature at which heat transfer is sought. Suitable adhesives would be known to the skilled artisan, and include acrylic and phenolic resins, among others.

In other embodiments, the flexible graphite sheet 102 can include a plurality of separate sheets, as described herein, having the sheets secured (i.e. laminated) together in only one or more portions of the entire sheet, such that in other portions of the sheet the separate sheets are not laminated together. In one example, the flex accommodating portion 120 (described below) includes a plurality of sheets which are not laminated together and one or both portions of the sheet supported by the spaced apart support members 104, 106 are laminated together. In another example, the flex accommodating portion 120 includes a plurality of sheets which are laminated together and one or both portions of the sheet supported by the spaced apart support members 104, 106 are not laminated together.

The flexible graphite sheet 102 may further include protective coatings on one or more sides. In other embodiments, only one or more portions of the sheet 102 includes protective coatings. In other embodiments, different portions of the sheet 102 can include different coatings. Coatings may include, but are not limited to, a polymer or metal coating and may be, for example, PET films, acrylic films, and thin metal coatings.

The flexible graphite sheet 102 or the sheets 202a, 202b, etc. making up the graphite sheet 102 may have a thickness of from between about 0.010 mm to 3.75 mm and a typical density of about 1.0 to 2.0 g/cc or higher. In one example, the one or more flexible graphite sheets have a thickness between about 0.025 mm to about 0.500 mm. In another example, flexible graphite sheets have a thickness between about 0.050 mm to about 0.250 mm. In one example, the flexible graphite sheet can have a density from between about 1.0 g/cc to about 2.0 g/cc. In another example, the flexible graphite sheet can have a density from between about 1.2 g/cc and about 1.8 g/cc. In one example, the flexible graphite can have a density of at least about 0.6 g/cc, more preferably at least about 1.1 g/cc. In another example, the flexible graphite can have a density of at least about 1.6 g/cc. The upper limit to the density of the graphite sheet is about 2.0 g/cc. One graphite sheet suitable for use in the thermal bridge in the present disclosure is commercially available as eGRAF® material, from GrafTech International Holdings Inc. of Independence, Ohio.

The flexible graphite sheet 102 has an in-plane thermal conductivity of at least 150 W/m*K. In still other embodiments, the graphite sheet 102 exhibits an in-plane thermal conductivity of at least 300 W/m*K. In still other embodiments the graphite sheet 102 exhibits an in-plane thermal conductivity of at least 400 W/m*K. In still other embodiments the graphite sheet 102 exhibits an in-plane thermal conductivity of at least 600 W/m*K. In still other embodiments the graphite sheet 102 exhibits an in-plane thermal conductivity of at least 700 W/m*K. In still other embodiments, the graphite sheet 102 exhibits an in-plane thermal conductivity of at least 1500 W/m*K. In one embodiment, the graphite sheet 102, 202a, 202b, etc. may be from 10 to 1500 microns thick.

The flexible graphite sheet 102 advantageously has a thickness between about 0.025 mm to about 0.500 mm, and more advantageously from between about 0.050 mm to about 0.250 mm. The flexible graphite sheet 102 advantageously has a density from between about 1.0 g/cc to about 2.0 g/cc and still more advantageously from between about 1.2 g/cc and about 1.8 g/cc.

The flexible graphite sheet may advantageously have a minimum bend radius of less than about 20.0 mm, more advantageously less than 10.0 mm and still more advantageously less than 6.0 mm. In this or other embodiments, the minimum bend radius may be from between about 1.0 mm to about 20.0 mm.

The graphite sheet 102 includes a free standing, flex accommodating section 120 spanning between the spaced apart support members 104 and 106. The flex accommodating section 120 is curved and thus longer than necessary to bridge the gap $D_G$. In one example, flex accommodating section 120 disposed between the spaced apart members 104 and 106 forms a Gaussian curve also known as a bell-shaped curve.

The flexibility of the graphite sheet 102 and the curved shape of the free standing, flex accommodating section 120 enables the graphite sheet to span the distance $D_G$ between the spaced apart support members 104, 106 while accommodating for potential differences in relative vibration between the support members by reducing the transmission of mechanical energy between them. The flex accommodating section 120 also enables the arrangement 100, 200, 400 to handle changes of relative orientation between the spaced apart support members 104, 106, such as one member rotating relative to the other.

The bell curve-shaped flex accommodating section 120 includes a central curved portion 122 disposed between oppositely disposed outwardly facing concave curved portions 124. The central curved shaped portion includes a radius $R_1$. The outwardly facing concave curved portions 124 have a radius $R_2$ and $R_3$. The flex accommodating section 120 spanning between the spaced apart support members 104 and 106 can be said to be free standing because it is not secured to other structures or support members.

Figure 3:
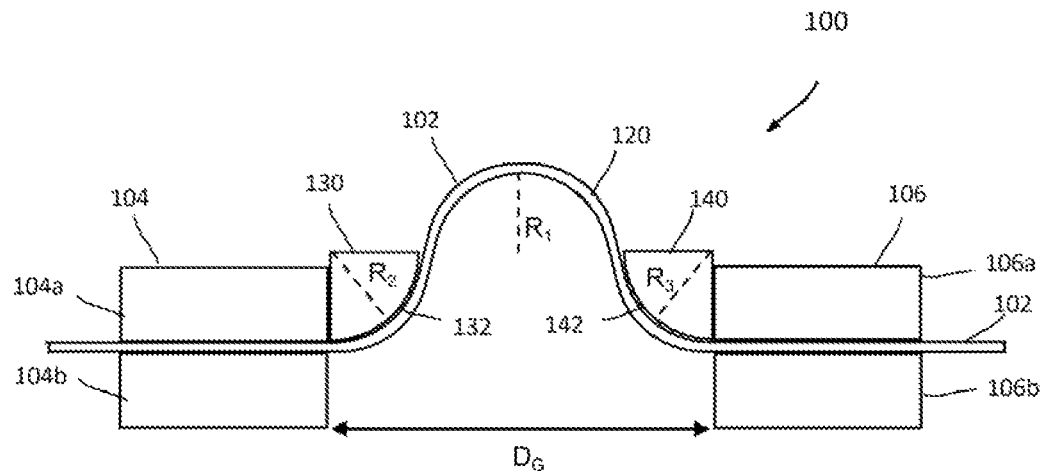
FIG. 3 is a side view of the flexible graphite sheet support structure using curve retention members having convex curved surfaces for maintaining minimum bend radii in the flexible graphite sheet.

Referring now to FIG. 3, a flexible graphite sheet support structure is shown which includes the flexible graphite sheet arrangement 100 described above and a first curve retention member 130 disposed adjacent one of the spaced apart support members 104 and a second curved retention member 140 disposed adjacent the other one of the spaced apart support members 106. The first curve retention member 130 includes a curved surface 132 disposed adjacent to one of the outwardly facing curved portions 124 of the flex accommodating section 120. The curved surface 132 can be considered to be convex, having a normal which extends towards the outwardly facing concave curved portion 124. The second curve retention member 140 includes a curved surface 142 disposed adjacent to the other outwardly facing concave curved portion 124 of the flex accommodating section 120. The curved surface 142 can also be considered to be convex, having a normal which extends towards the outwardly facing curved portion 124, which can be considered to be concave.

The curve retention members 130 and 140 can be quarter round members having suitable convex curved surfaces 132, 142. It is contemplated that the curve retention members can have a variety of other shapes that include suitable convex curved surfaces 132, 142 disposed adjacent and facing respective concave curved surfaces 124 of the flex accommodating section 122.

The first and second curve retention members 130 and 140 can be disposed adjacent to but separate from the support members, 104 and 106 respectively, as shown in FIG. 3. Alternatively, the first and second curve retention members 130 and 140 can be formed integrally with the respective adjacent support members, 104 and 106 respectively, such that the curved surfaces 132 and 142 are formed on the support members a shown in FIG. 4.

Figure 4:
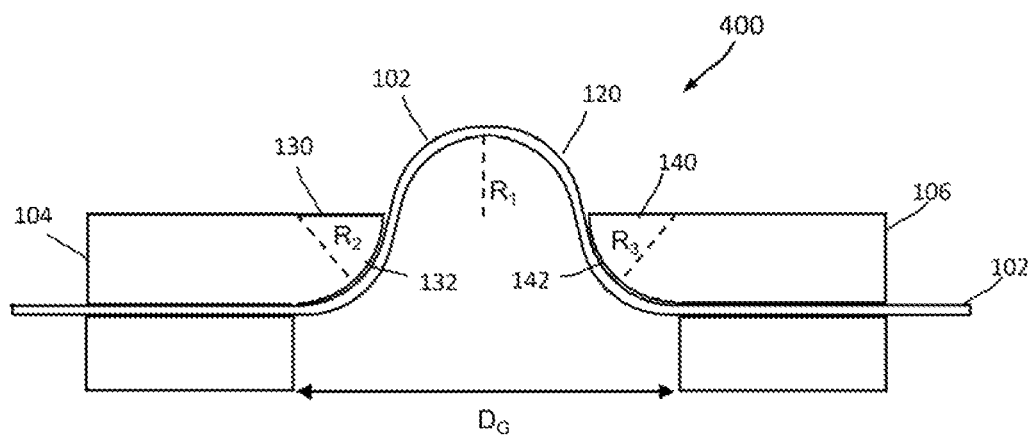
FIG. 4 is side view of another example of the flexible graphite sheet support structure using curve retention members that are integral to the spaced apart support members.
Figure 5:
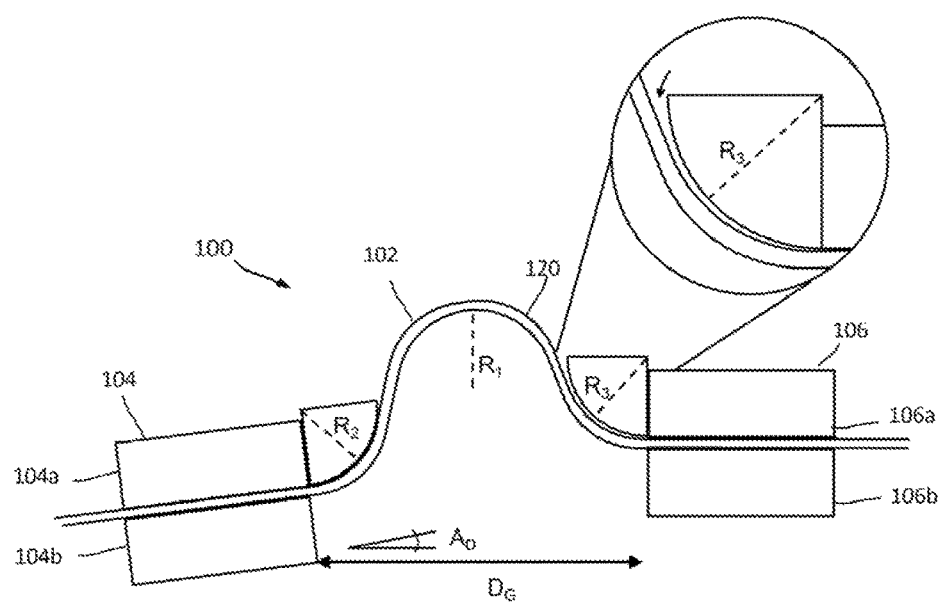
FIG. 5 is side view of a flexible graphite sheet support structure illustrating the relative movement between the spaced apart support members.

Referring now to FIG. 4, the oppositely disposed outwardly facing concave curved portions 124 of the flex accommodating section 120 flexible graphite sheet 102 are not secured to the adjacent convex curved surfaces 132, 142 of the respective curve retention members 130, 140. This enables the convex curved surfaces 132, 142 of the curve retention members 130, 140 to maintain bend radii in the flexible graphite sheet which are predetermined and greater than the minimum bend radii of the flexible graphite sheet 102 while allowing one of the support members 104 to move relative to the other support member. Example of this movement can include, but is not limited to relative rotation of one support member with respect to the other. As can be seen in the enlarged portion, the concave curved portion will move away from the convex curved surface of the curve retention member during relative rotation.

The outwardly facing concave curved portions 132 and 142 of the flexible graphite sheet have respective radii $R_2$ and $R_3$ and the central curved portion of the flex accommodating section has a radius $R_1$. In one example, $R_1 \neq R_2$ and $R_1 \neq R_3$. In another example $R_1 = R_2 = R_3$. In another example, $R_2$ and $R_3$ are constant over the convex curved surfaces. In another example, $R_2 \neq R_3$.

In another example $R_2$ and $R_3$ vary along the convex curved surface, the convex curved surface defining a surface which is not a circular curve. Non-limiting examples can include a Euler spiral, a spiral curve or a cubic curve, among others.

In other examples, wherein the support members are spaced apart by distance $D_G$, $R_1 = R_2 = R_3$ and $R_1 + R_1 + R_2 + R_3 = D_G$. This configuration keeps the flex accommodating section 120 of the flexible graphite sheet 102 at a near optimal bell shaped curve.

The flexible graphite sheet 102, spaced apart support members 104, 106, and the convex curved surfaces of the curve retention members form a flexible graphite sheet support structure which can be used as a thermal management arrangement 100, 200, 400 for a device by transferring heat from one side having the support member 104 to another side having the support member 106. The heat can be generated by one or more electronic components (not shown) in thermal contact with the flexible graphite sheet 102. Examples of the electronic components can include but are not limited to a processor, memory module, application specific integrated circuits (ASIC), graphics processors, light emitting diodes (LED), or field effect transistors (Power FETs, IGBTs, etc.). The flex accommodating section 120 enables the flexible graphite sheet 102 to transfer the heat across the span between the support members 104, 106 while reducing the transference of vibrations between them and accommodating for relative movement between them a stated above. In one example, quarter round members were used for the curve retention members 130 and 140, each having convex curved surfaces 132, 142 arranged as described above. One of the spaced apart support members 104 and 106 was rotated 10 degrees relative to the other while the flex accommodating section 120 retained a desired shape as described above. The arrangement was flex tested for up to 53,000 cycles and demonstrated no change in thermal performance of the flexible graphite sheet 102.

The various embodiments described herein can be practiced in any combination thereof. The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A flexible graphite sheet support structure comprising:
   a first support member and a second support member spaced apart from the first support member, wherein one of the first and second support members is adapted for movement relative to the other;
   a flexible graphite sheet secured to the first and second spaced apart support members and having a free standing flex accommodating section extending between the first and second spaced apart members, wherein the flex accommodating section is bell curve-shaped having a central curved portion disposed between and adjacent to oppositely disposed outwardly facing concave curved portions such that the free standing flex accommodating section is not secured to other structures; and
   a first curve retention member disposed adjacent to the first support member, the first curve retention member having a convex curved surface disposed adjacent and facing a respective one of the outwardly facing concave curved portions, and a second curve retention member disposed adjacent to the second support member, the second curve retention member having a convex curved surface disposed adjacent and facing the other one of the outwardly facing concave curved portions, wherein the flexible graphite sheet is not secured to the convex curved surfaces.

2. The flexible graphite sheet support structure of claim 1 wherein the flexible graphite sheet has a thickness from between about 0.025 mm to about 0.500 mm and a density from between about 0.6 g/cc to about 2.0 g/cc.

3. The flexible graphite sheet support structure of claim 1 wherein the outwardly facing concave curved portions of the flexible graphite sheet have respective radii $R_2$ and $R_3$ and the central curved portion has a radius $R_1$, and further comprising at least one of:
   a. $R_1 \neq R_2$ and $R_1 \neq R_3$;
   b. $R_1 = R_2 = R_3$;
   c. $R_2 \neq R_3$;
   d. $R_2$ and $R_3$ are constant over the convex curved surfaces;
   e. $R_2$ and $R_3$ are equal over the convex curved surfaces; and
   f. $R_2$ and $R_3$ vary along the convex curved surfaces such that the convex curved surfaces define surfaces which are at least one of non-circular curves, Euler spirals, spiral curves and cubic curves.

4. The flexible graphite sheet support structure of claim 1 wherein the outwardly facing concave curved portions of the flexible graphite sheet have respective radii $R_2$ and $R_3$ and the central curved portion has a radius $R_1$, and wherein the support members are spaced apart by distance $D_G$ and wherein $R_1 + R_1 + R_2 + R_3 = D_G$ and $R_1 = R_2 = R_3$.

5. The flexible graphite sheet support structure of claim 1 wherein the flexible graphite sheet further comprises at least one portion which includes a plurality of graphite sheets laminated together and at least one portion which includes the plurality of graphite sheets as separate graphite sheets not laminated together.

6. The flexible graphite sheet support structure of claim 1 wherein the flexible graphite sheet comprises at least one of one or more sheets of compressed particles of exfoliated graphite and one or more sheets of pyrolytic graphite.

7. A thermal management arrangement comprising:
   a first support member;
   a second support member spaced apart from the first support member; and
   a flexible graphite sheet secured to the first and second support members for transferring heat across a span between the first and second spaced apart support members, the flexible graphite sheet having a free standing curve-shaped flex accommodating section extending between the spaced apart support members, wherein the flex accommodating section has a central curved portion disposed between and adjacent to oppositely disposed outwardly facing concave curved portions such that a first one of the concave curved portions is disposed adjacent the first support member and a second one of the concave curved portions is disposed adjacent the second support member, and wherein the free standing flex accommodating section is not secured to other structures.

8. The thermal management arrangement according to claim 7 further comprising at least one heat generating electronic component in thermal contact with the flexible graphite sheet.

9. The thermal management arrangement of claim 7 further comprising:
a first curve retention member disposed adjacent to the first support member, the first curve retention member having a convex curved surface disposed adjacent and facing a respective one of the outwardly facing concave curved portions for maintaining predetermined bend radius in the flexible graphite; and
a second curve retention member disposed adjacent to the second support member, the second curve retention member having a convex curved surface disposed adjacent and facing the other one of the outwardly facing concave curved portions for maintaining predetermined bend radius in the flexible graphite.

10. The thermal management arrangement according to claim 7 wherein the flexible graphite sheet comprises at least one of one or more sheets of compressed particles of exfoliated graphite and one or more sheets of pyrolytic graphite.

11. The thermal management arrangement according to claim 7 wherein the flexible graphite sheet has an in-plane thermal conductivity of at least 150/m*K.

12. The thermal management arrangement according to claim 7 wherein the flexible graphite sheet has a thickness from between about 0.025 mm to about 0.500 mm and a density from between about 0.6 g/cc to about 2.0 g/cc.

13. The thermal management arrangement according to claim 9 wherein the flexible graphite sheet is not secured to the convex curved surfaces of the curve retention members.

14. The thermal management arrangement according to claim 7 wherein the flexible graphite sheet includes a plurality of flexible graphite sheets as separate graphite sheets not laminated together.

15. The thermal management arrangement according to claim 7 wherein the flexible graphite sheet includes at least one portion which includes a plurality of graphite sheets laminated together and at least one portion which includes the plurality of graphite sheets as separate graphite sheets not laminated together.

16. A method of forming a thermal management arrangement comprising:
providing first and second spaced apart support members forming a span between the spaced apart support members;
securing a flexible graphite sheet to the first and second spaced apart support members forming a free standing curve-shaped flex accommodating section extending between the first and second spaced apart members, wherein the flex accommodating section has a central curved portion disposed between and adjacent to oppositely disposed outwardly facing concave curved portions such that a first one of the concave curved portions is disposed adjacent the first support member and a second one of the concave curved portions is disposed adjacent the second support member, and wherein the free standing flex accommodating section is not secured to other structures;
generating heat with a heat source in thermal contact with flexible graphite sheet; and
transferring the heat across the span using the flexible graphite sheet.

17. The method of claim 16 further comprising moving one of the first and second support members relative to the other of the first and second support members.

18. The method of claim 16 wherein the flexible graphite sheet includes a plurality of separate graphite sheets.

19. The method of claim 16 wherein the flex accommodating portion includes a plurality of graphite sheets as separate graphite sheets not laminated together.

20. The flexible graphite sheet support structure of claim 1 wherein a first one of the concave curved portions is disposed adjacent the first support member and a second one of the concave curved portions is disposed adjacent the second support member.

21. The flexible graphite sheet support structure of claim 1 wherein the flexible graphite sheet consists of one or more sheets of compressed particles of exfoliated graphite.

22. The flexible graphite sheet support structure of claim 1 wherein the flexible graphite sheet consists of one or more sheets of pyrolytic graphite.

23. The flexible graphite sheet support structure of claim 1 wherein the first curve retention member is formed integrally with the first support member and the second curve retention member is formed integrally with the second support member.

24. The thermal management arrangement of claim 7 wherein the flexible graphite sheet consists of one or more sheets of compressed particles of exfoliated graphite.

25. The thermal management arrangement of claim 7 wherein the flexible graphite sheet consists of one or more sheets of pyrolytic graphite.

26. The thermal management arrangement of claim 7 wherein the first curve retention member is formed integrally with the first support member and the second curve retention member is formed integrally with the second support member.

27. The method of claim 16 wherein the flexible graphite sheet consists of one or more sheets of compressed particles of exfoliated graphite.

28. The method of claim 16 wherein the flexible graphite sheet consists of one or more sheets of pyrolytic graphite.

29. The method of claim 16 wherein the flexible graphite sheet comprises one or more sheets of pyrolytic graphite and one or more sheets of compressed particles of exfoliated graphite.

* * * * *

UNITED STATES PATENT AND TRADEMARK OFFICE
CERTIFICATE OF CORRECTION

PATENT NO. : 10,177,070 B2
APPLICATION NO. : 15/529644
DATED : January 8, 2019
INVENTOR(S) : Dornauer et al.

It is certified that error appears in the above-identified patent and that said Letters Patent is hereby corrected as shown below:

In the Claims

Column 7 Lines 26-28, Claim 11 should be corrected to read:
--11. The thermal management arrangement according to claim 7 wherein the flexible graphite sheet has an in-plane thermal conductivity of at least 150 W/m*K.--

Signed and Sealed this
Second Day of August, 2022

Katherine Kelly Vidal
*Director of the United States Patent and Trademark Office*